(12) United States Patent
Lyu (10) Patent No.: US 8,240,541 B2
(45) Date of Patent: Aug. 14, 2012

(54) APPARATUS FOR MOUNTING SEMICONDUCTOR CHIP

(75) Inventor: Juhyun Lyu, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/228,088

(22) Filed: Sep. 8, 2011

(65) Prior Publication Data

US 2012/0104074 A1    May 3, 2012

(30) Foreign Application Priority Data

Oct. 29, 2010    (KR) .................. 10-2010-0106951

(51) Int. Cl.
*B23K 1/00* (2006.01)
*B23K 37/04* (2006.01)

(52) U.S. Cl. .................... 228/33; 228/49.5; 228/56.2

(58) Field of Classification Search .......... None
See application file for complete search history.

(56) References Cited

U.S. PATENT DOCUMENTS

| | | | |
|---|---|---|---|
| 6,019,275 A * | 2/2000 | Akin et al. ............... 228/207 |
| 7,353,596 B2 * | 4/2008 | Shida et al. .................. 29/844 |
| 2002/0100972 A1 * | 8/2002 | Kitajima et al. ............ 257/734 |
| 2003/0029033 A1 * | 2/2003 | Hidese et al. ................. 29/833 |
| 2003/0177633 A1 * | 9/2003 | Haji et al. ..................... 29/743 |
| 2003/0213832 A1 * | 11/2003 | Kang et al. ............... 228/180.22 |
| 2004/0182910 A1 * | 9/2004 | Shafie ........................ 228/41 |
| 2005/0045914 A1 * | 3/2005 | Agranat et al. .............. 257/200 |
| 2005/0108873 A1 * | 5/2005 | Hidese et al. .................. 29/832 |
| 2005/0284921 A1 * | 12/2005 | Sakai et al. ................ 228/248.1 |
| 2006/0201999 A1 * | 9/2006 | Haji ........................ 228/112.1 |
| 2007/0039686 A1 * | 2/2007 | Makino et al. ................ 156/249 |
| 2009/0057372 A1 * | 3/2009 | Niizuma et al. ................... 228/9 |
| 2009/0159216 A1 * | 6/2009 | Furuta et al. ................ 156/501 |
| 2010/0019018 A1 * | 1/2010 | Baumann et al. ............ 228/223 |
| 2010/0051671 A1 * | 3/2010 | Ling et al. ..................... 228/103 |
| 2010/0200284 A1 * | 8/2010 | Seki et al. ..................... 174/260 |
| 2011/0232082 A1 * | 9/2011 | Kim et al. ....................... 29/740 |

FOREIGN PATENT DOCUMENTS

| | | |
|---|---|---|
| JP | 2000-22394 A | 1/2000 |
| KR | 10-0373873 B1 | 4/2003 |
| KR | 10-2009-0096706 A | 9/2009 |
| KR | 10-0921231 B1 | 10/2009 |

* cited by examiner

*Primary Examiner* — Kiley Stoner
(74) *Attorney, Agent, or Firm* — Sughrue Mion, PLLC (57) ABSTRACT

Provided are an apparatus and a method for mounting a semiconductor chip. The semiconductor chip mounting apparatus includes a flux reservoir, a flux reservoir moving unit, a wafer support part, a wiring board support part, a transfer head, and a mounting head. The flux reservoir includes an accommodation recess in an upper surface to accommodate flux. The flux reservoir moving unit linearly moves the flux reservoir. The wafer support part is adjacent to a moving path of the flux reservoir and supports a wafer including a semiconductor chip. The wiring board support part is adjacent to the moving path and supports a wiring board. The transfer head picks up and places the semiconductor chip in the accommodation recess. The mounting head picks up the semiconductor chip from the accommodation recess and mounts the semiconductor chip on the wiring board through a surface mount process.

11 Claims, 11 Drawing Sheets

APPARATUS FOR MOUNTING SEMICONDUCTOR CHIP

CROSS-REFERENCE TO RELATED APPLICATION

This application claims priority under 35 U.S.C. §119 from Korean Patent Application No. 10-2010-0106951, filed on Oct. 29, 2010, the entire contents of which are hereby incorporated by reference.

BACKGROUND

Apparatuses and methods consistent with exemplary embodiments relate to a semiconductor chip mounting apparatus, and more particularly, to an apparatus for mounting a semiconductor chip on a wiring board through a surface mount process.

Due to the recent trends such as high integration and high speed of semiconductor chips, semiconductor chips are miniaturized, and the number of input/output pins on semiconductor chips has increased. Accordingly, flip chip bonding methods are widely used to mount semiconductor chips. In a flip chip bonding method, a semiconductor chip is directly mounted on a mount target member through conductive bumps. Flip chip bonding is superior in speed, integration, and miniaturization to wire bonding methods and tape automated bonding (TAB) methods using a tape wiring board.

SUMMARY

One or more exemplary embodiments described herein provide a semiconductor chip mounting apparatus that can improve the productivity of a surface mount process for a semiconductor chip.

According to an aspect of an exemplary embodiment, a semiconductor chip mounting apparatuses includes: a flux reservoir including a flux accommodation recess in an upper surface; a flux reservoir moving unit which moves the flux reservoir along a moving path; a wafer support part which is adjacent to the moving path of the flux reservoir and supports a wafer including a semiconductor chip; a wiring board support part which is adjacent to the moving path of the flux reservoir and supports a wiring board; a transfer head which picks up the semiconductor chip and places the semiconductor chip in the accommodation recess; and a mounting head which picking up the semiconductor chip from the accommodation recess and mounts the semiconductor chip on the wiring board through a surface mount process.

The flux reservoir moving unit may move the flux reservoir along the moving path between a first point and a second point, the first point may be adjacent to the wafer support part, and the second point may be adjacent to the wiring board support part.

The transfer head may include: a flip head which is disposed between the wafer support part and the first point and picks up and flips the semiconductor chip, and a landing head which is disposed between the flip head and the first point, receives the flipped semiconductor chip from the flip head and places the flipped semiconductor chip in the accommodation recess.

The semiconductor chip mounting apparatuses may further include a camera which is disposed between the second point and the wiring board support part and reads position information of a solder bump provided to a surface of the semiconductor chip transferred by the mounting head.

The flux reservoir moving unit may include a flux reservoir guide rail which extends in a straight line between the first point and the second point and guides a movement of the flux reservoir.

The semiconductor chip mounting apparatuses may further include: a container which is disposed on the upper surface of the flux reservoir and comprises an inner space with an open bottom surface; and a container moving unit which moves the container between a first and a second end of the accommodation recess to change a relative position of the container with respect to the flux reservoir, wherein the upper surface of the flux reservoir comprises stand-by regions, each of which having an area equal to or greater than that of the bottom surface of the container, wherein a first stand-by region is disposed at a first end of the accommodation recess and a second stand-by region is disposed at a second end of the accommodation recess. The inner space of the container and each of the stand-by regions form a space storing the flux.

The container may include: a first side wall extending in a direction perpendicular to a movement direction of the container; and a second side wall facing the first side wall and parallel to the first side wall, wherein a bottom surface of the first side wall and a bottom surface of the second side wall contact the upper surface of the flux reservoir.

According to an aspect of another exemplary embodiment, a semiconductor chip mounting method includes: placing a wafer including a semiconductor chip, on a wafer stage; disposing a flux reservoir near the wafer stage, the flux reservoir accommodating a flux in an accommodation recess; picking up and placing the semiconductor chip of the wafer in the accommodation recess; moving the flux reservoir accommodating the semiconductor chip to dispose the flux reservoir near a wiring board support part supporting a wiring board; and picking up and mounting the semiconductor chip on the wiring board through a surface mount process.

The moving of the flux reservoir may include linearly moving the flux reservoir from a first point adjacent to the wafer stage to a second point adjacent to the wiring board support part.

The placing of the semiconductor chip in the accommodation recess may include: placing the semiconductor chip such that an upper surface thereof provided with a solder bump is directed downward; and immersing the solder bump in the flux.

The upper surface of the semiconductor chip may be directed upward on the wafer, and the method may further include picking up and flipping the semiconductor chip such that the upper surface of the semiconductor chip is directed downward, before the semiconductor chip is placed in the accommodation recess.

The semiconductor chip mounting method may further include filling the accommodation recess with flux, wherein the flux is sequentially and continuously supplied from one end of the accommodation recess to an opposite end of the accommodation recess.

The accommodation recess may be filled with the flux while the flux reservoir moves from the second point to the first point.

The mounting of the semiconductor chip on the wiring board may include: picking up the semiconductor chip; optically inspecting position information of a solder bump of the semiconductor chip; and mounting the semiconductor chip on the wiring board through the surface mount process, wherein the picking up of the semiconductor chip, the inspecting of the position information, the mounting of the semiconductor chip are sequentially and continuously performed.

According to an aspect of another exemplary embodiment, a semiconductor chip mounting apparatus includes: a flux reservoir guide rail linearly extending in a first direction; a flux reservoir placed on the flux reservoir guide rail and including an accommodation recess in an upper surface thereof, the accommodation recess being filled with a flux; a flux reservoir driving part moving the flux reservoir along the flux reservoir guide rail; a wafer support part adjacent to a first end of the flux reservoir guide rail in the first direction and supporting a wafer including a semiconductor chip; a transfer head disposed between the wafer support part and the flux reservoir guide rail and picking up and placing the semiconductor chip of the wafer in the accommodation recess; a wiring board support part adjacent to a second end of the flux reservoir guide rail in a second direction perpendicular to the first direction from a top view, the wiring board support part supporting a wiring board; and a mounting head picking up the semiconductor chip from the accommodation recess and transferring and mounting the semiconductor chip on the wiring board through a surface mount process.

The semiconductor chip mounting apparatuses may further include: a container disposed over the flux reservoir and having an inner space for storing the flux, the container including a discharge hole in a bottom surface thereof, the discharge hole communicating with the inner space; and a container moving unit moving the container in a straight line between sides of the accommodation recess to change a relative position of the container to the flux reservoir.

The bottom surface of the container may contact the upper surface of the flux reservoir.

The transfer head may include: a flip head picking up and flipping the semiconductor chip of the wafer; and a landing head receiving the flipped semiconductor chip from the flip head and placing the semiconductor chip in the accommodation recess.

The semiconductor chip mounting apparatuses may further include a camera that is disposed between the wiring board support part and the second end of the flux reservoir guide rail and optically inspects a solder bump disposed on an upper surface of the semiconductor chip transferred by the mounting head.

The semiconductor chip mounting apparatuses may further include a mounting head control part that controls a movement of the mounting head to sequentially and continuously perform the picking up of the semiconductor chip by the mounting head and the inspecting of the solder bump.

BRIEF DESCRIPTION OF THE DRAWINGS

The above and/or other aspects will become apparent and more readily appreciated from the following description of exemplary embodiments, together with the accompanying drawings in which.

DETAILED DESCRIPTION

Exemplary embodiments will be described below in more detail with reference to the accompanying drawings. Embodiments may, however, be embodied in different forms and should not be construed as limited by the description set forth herein. Like reference numerals refer to like elements throughout. Moreover, detailed descriptions related to well-known functions or configurations will be omitted in order not to unnecessarily obscure subject matters described herein.

Figure 1:
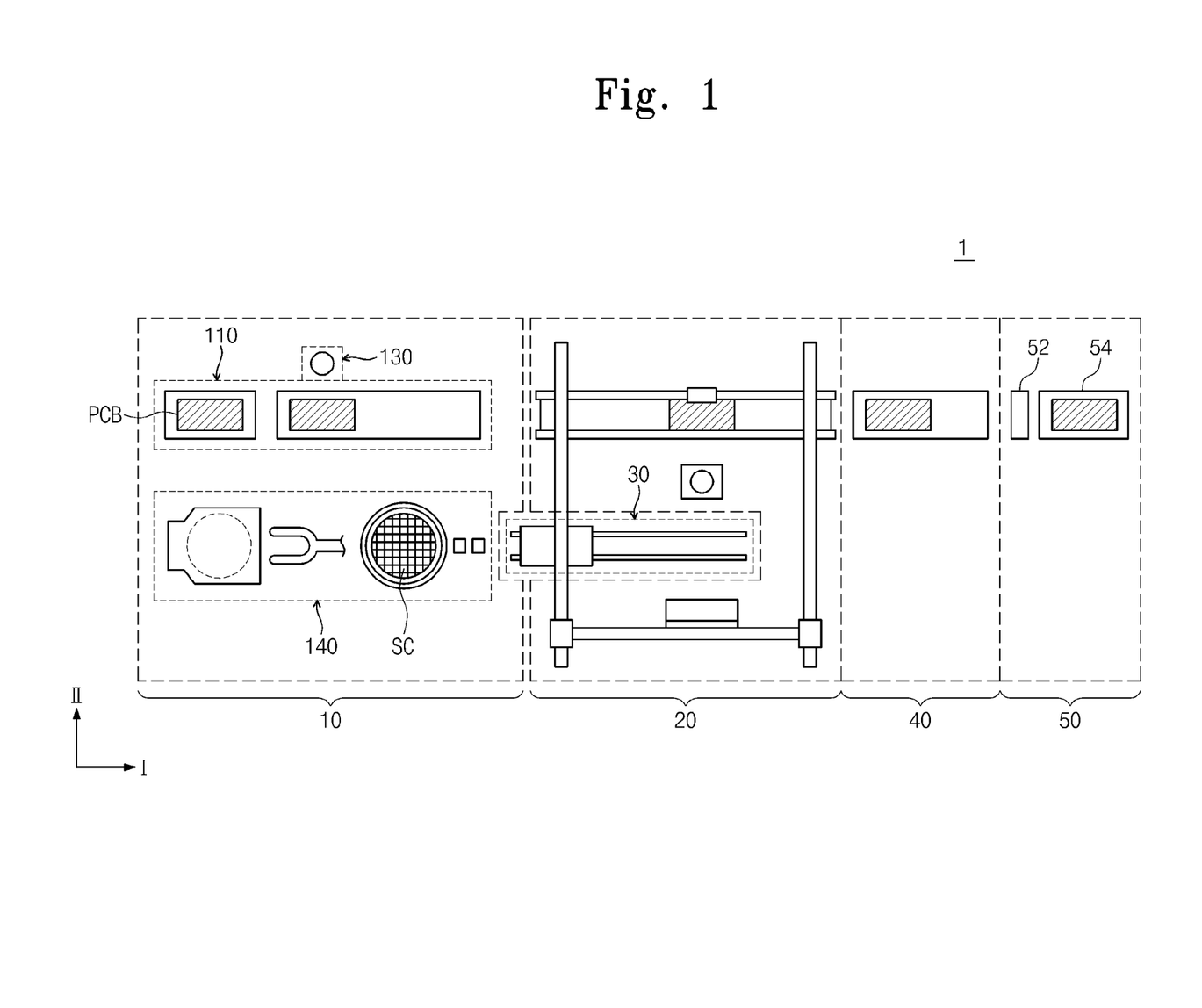
FIG. 1 is a schematic view illustrating a semiconductor chip mounting apparatus according to an exemplary embodiment.

FIG. 1 is a schematic view illustrating a semiconductor chip mounting apparatus according to an exemplary embodiment.

Referring to FIG. 1, a semiconductor chip mounting apparatus includes a loading part 10, a mounting part 20, a semiconductor chip transfer part 30, a reflowing part 40, and an unloading part 50. The loading part 10, the mounting part 20, the reflowing part 40, and the unloading part 50 are sequentially arrayed in a first direction I. A direction perpendicular to the first direction I from a top view is referred to as a second direction II, and a direction perpendicular to the first and second directions I and II is referred to as a third direction III (see FIG. 2).

The loading part 10 is adjacent to the mounting part 20, and supplies semiconductor chips (SCs) and a wiring board printed circuit board (PCB) to the mounting part 20. The semiconductor chip SC includes a flip chip including solder bumps, and the wiring board PCB may be a printed circuit board including connection pads and circuit wiring. The mounting part 20 mounts the semiconductor chip SC on the wiring board PCB through a surface mount process. The semiconductor chip transfer part 30 is disposed in the loading part 10 and the mounting part 20, connecting the two, and transfers the semiconductor chip SC from the loading part 10 to the mounting part 20. The reflowing part 40 is adjacent to the mounting part 20, and reflows the solder bump of the semiconductor chip SC to attach the solder bump to a contact pad of the wiring board PCB. The unloading part 50 is adjacent to the reflowing part 40 and unloads the wiring board PCB coupled to the semiconductor chip SC.

The loading part 10 includes a board supply unit 110, a detector 130, and a semiconductor chip supply unit 140. The board supply unit 110 supplies the wiring board PCB to the mounting part 20. The detector 130 is disposed at a side of the board supply unit 110 and reads a reject mark on the wiring board PCB. The reject mark indicates whether a semiconductor chip mounting region disposed on the wiring board PCB has a defect or not. The semiconductor chip supply unit 140 may be disposed adjacent to a side of the board supply unit 110 in the second direction II. The semiconductor chip supply unit 140 supplies the semiconductor chip SC to the semiconductor chip transfer part 30.

Figure 2:
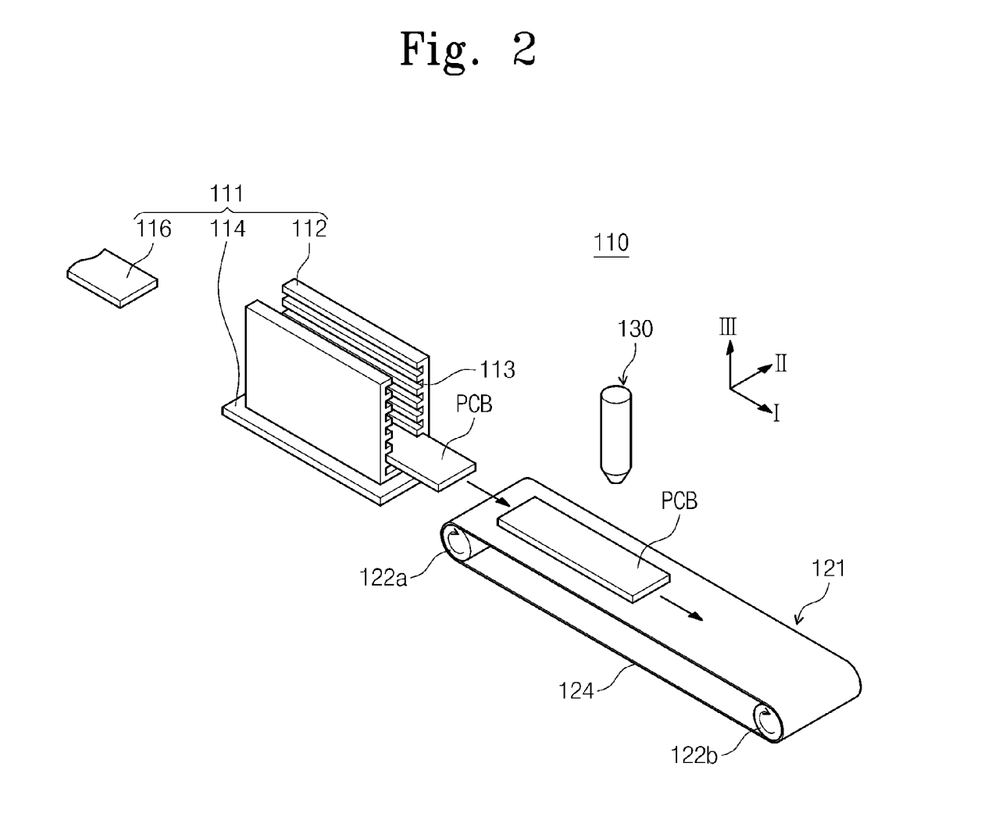
FIG. 2 is a perspective view illustrating the board supply unit of FIG. 1.

FIG. 2 is a perspective view illustrating the board supply unit of FIG. 1. Referring to FIG. 2, the board supply unit 110 includes a loader 111 and a conveyor 121. The loader 111 loads and transfers the wiring board PCB to the conveyor 121. The conveyor 121 conveys the wiring board PCB to the mounting part 20.

The loader 111 loads the wiring board PCB by inserting the wiring board PCB into slots 113 of a magazine 112. The loader 111 includes the magazine 112, a lift table 114, and a pusher 116. The magazine 112 extends in the first direction I and has a U-shape with open front, open rear and open upper parts. The slots 113 for receiving the wiring board PCB are arrayed in the third direction III (one on top of the other) within the magazine 112.

The magazine 112 is installed on the lift table 114 that may be moved upward or downward by a driving member. The pusher 116 is disposed on an input side of the magazine 112 and pushes the wiring board PCB form the rear in order to eject it from the magazine 112. The wiring board PCB disposed at a first height within the magazine 112 and is ejected from the magazine 112 by the pusher 116, then, the magazine 112 is moved upward by the driving member, and then, the pusher 116 ejects another one of the wiring boards PCB at a second height of the magazine 112, that is, at a height lower than the first height.

The conveyor 121 extends in the first direction I and is adjacent to an output side of the magazine 112. The conveyor 121 includes rollers 122*a* and 122*b* that are parallel to and spaced apart from each other in the first direction I, and a conveyer belt 124 that is wound around the rollers 122*a* and 122*b*. The wiring board PCB ejected from the magazine 112 is placed on the conveyer belt 124. The upper part of the conveyer belt 124 moves in the first direction I according to a clockwise rotation of the rollers 122*a* and 122*b*, and the wiring board PCB placed on the conveyer belt 124 moves in the first direction I accordingly. A wiring board support part 310 illustrated in FIG. 7, which will be described later, is disposed at an output side of the conveyor 121, and the wiring board PCB is moved to the wiring board support part 310 by the conveyor 121.

Figure 3:
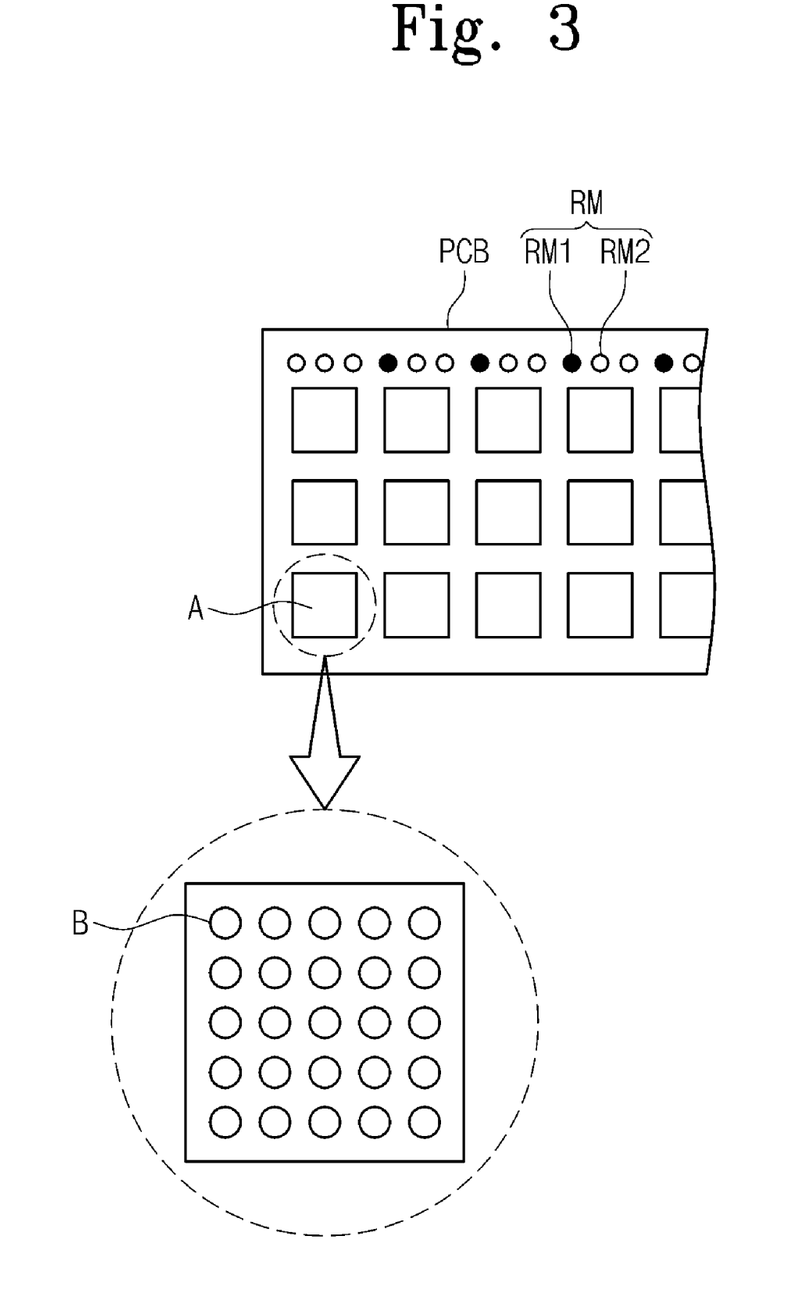
FIG. 3 is a schematic view illustrating a wiring board according to an exemplary embodiment.

The detector 130 is disposed over a side part of the conveyor 121 and reads the reject mark on the wiring board PCB conveyed by the conveyor 121. Referring to FIG. 3, reject marks RM are arrayed in a line on a side of the wiring board PCB, and semiconductor chip mounting regions A are disposed adjacent to the reject marks RM. Each of the semiconductor chip mount regions A includes connection pads B to which solder bumps of a semiconductor chip are attached. The number of the reject marks RM corresponds to the number of the semiconductor chip mounting regions A, and the reject marks RM indicate whether the semiconductor chip mounting regions A have a defect or not. For example, a first reject mark RM 1 in black indicates that a corresponding one of the semiconductor chip mounting regions A has a defect, a second reject mark RM 2 in white indicates that a corresponding one of the semiconductor chip mounting regions A has no defect.

When the detector 130 reads the reject marks RM of the wiring board PCB, a defective one can be detected among the semiconductor chip mounting regions A. When a read result of the detector 130 is transmitted to the mounting part 20, the mounting part 20 mounts semiconductor chips on the semiconductor chip mounting regions A except for those mounting regions which have been determined to be defective.

Figure 4:
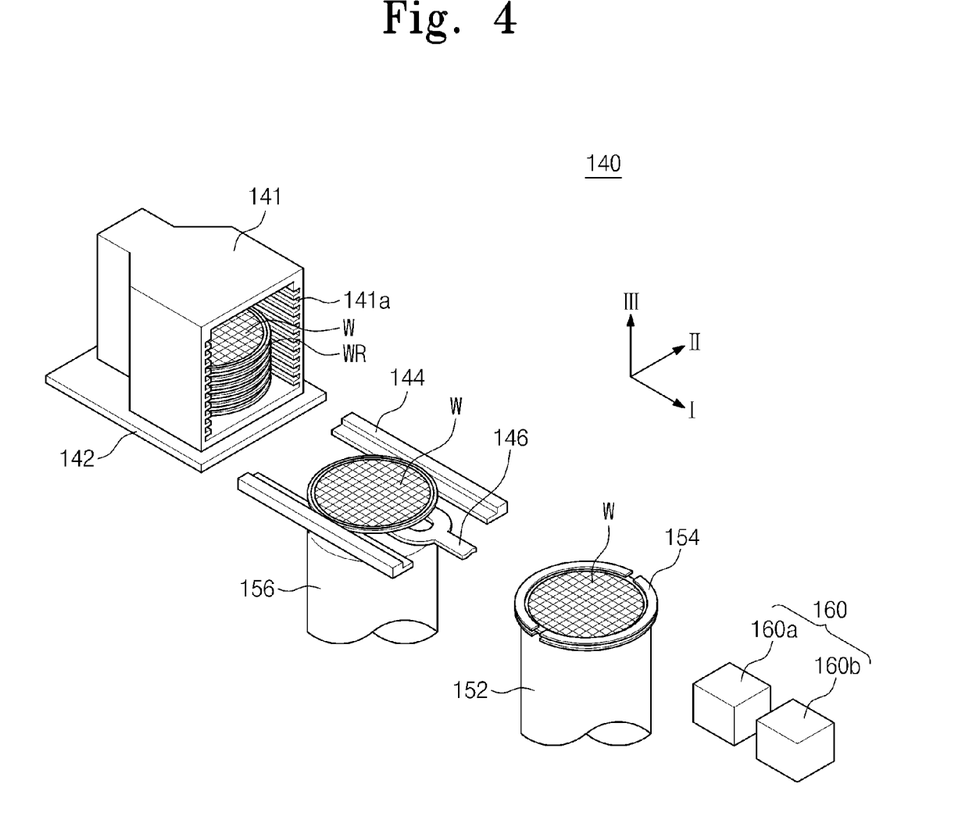
FIG. 4 is a perspective view illustrating the semiconductor chip supply unit of FIG. 1.

FIG. 4 is a perspective view illustrating the semiconductor chip supply unit of FIG. 1. Referring to FIG. 4, the semiconductor chip supply unit 140 supplies semiconductor chips to the semiconductor chip transfer part 30. The semiconductor chip supply unit 140 includes a wafer cassette 141, a wafer transfer 146, a wafer support part 152, a tape expander 154, and a transfer head 160.

Figure 5:
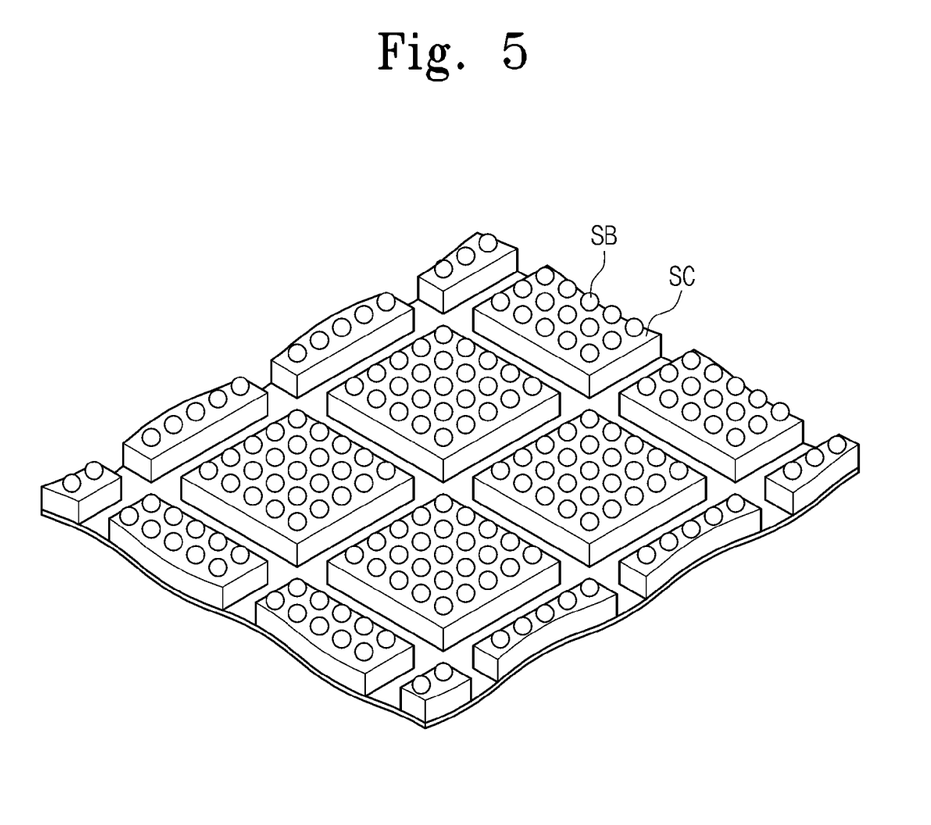
FIG. 5 is a perspective view illustrating semiconductor chips isolated from one another on a wafer according to an exemplary embodiment.

The wafer cassette 141 is placed on a cassette support 142. Slots 141*a* for accommodating wafers W are disposed within the wafer cassette 141. Before the wafers W are accommodated within the slots 141*a*, a fabrication (FAB) process, a back grinding process, and a sawing process may be performed on the wafers W. An ultraviolet tape for dicing is attached to the rear (lower) surface of the wafer W, and a wafer ring WR supports an edge of the wafer W. Referring to FIG. 5, the semiconductor chips SC formed on the wafer W are isolated from one another through the sawing process. Solder bumps SB are disposed on the upper surface of the semiconductor chip SC.

The wafer transfer 146 takes the wafer W out of the wafer cassette 141 and places the wafer W on load rails 144. An ultraviolet irradiation device 156 may be disposed under the load rails 144. The ultraviolet irradiation device 156 emits ultra violet rays to the ultraviolet tape attached to the rear surface of the wafer W to decrease the adhering force of the ultraviolet tape.

The wafer support part 152 is disposed at an output side of the load rails 144. The wafer W disposed on the load rails 144 is transferred to the wafer support part 152 by the wafer transfer 146 and is supported by the wafer support part 152. The tape expander 154 is disposed on the upper end of the wafer support part 152. The tape expander 154 pulls the wafer ring WR to expand the ultraviolet tape, thereby efficiently picking up the semiconductor chip SC on the wafer W.

The transfer head 160 is disposed between the wafer support part 152 and the semiconductor chip transfer part 30. The transfer head 160 picks up the semiconductor chips SC of the wafer W one by one and places the semiconductor chip SC on the semiconductor chip transfer part 30.

Figure 6:
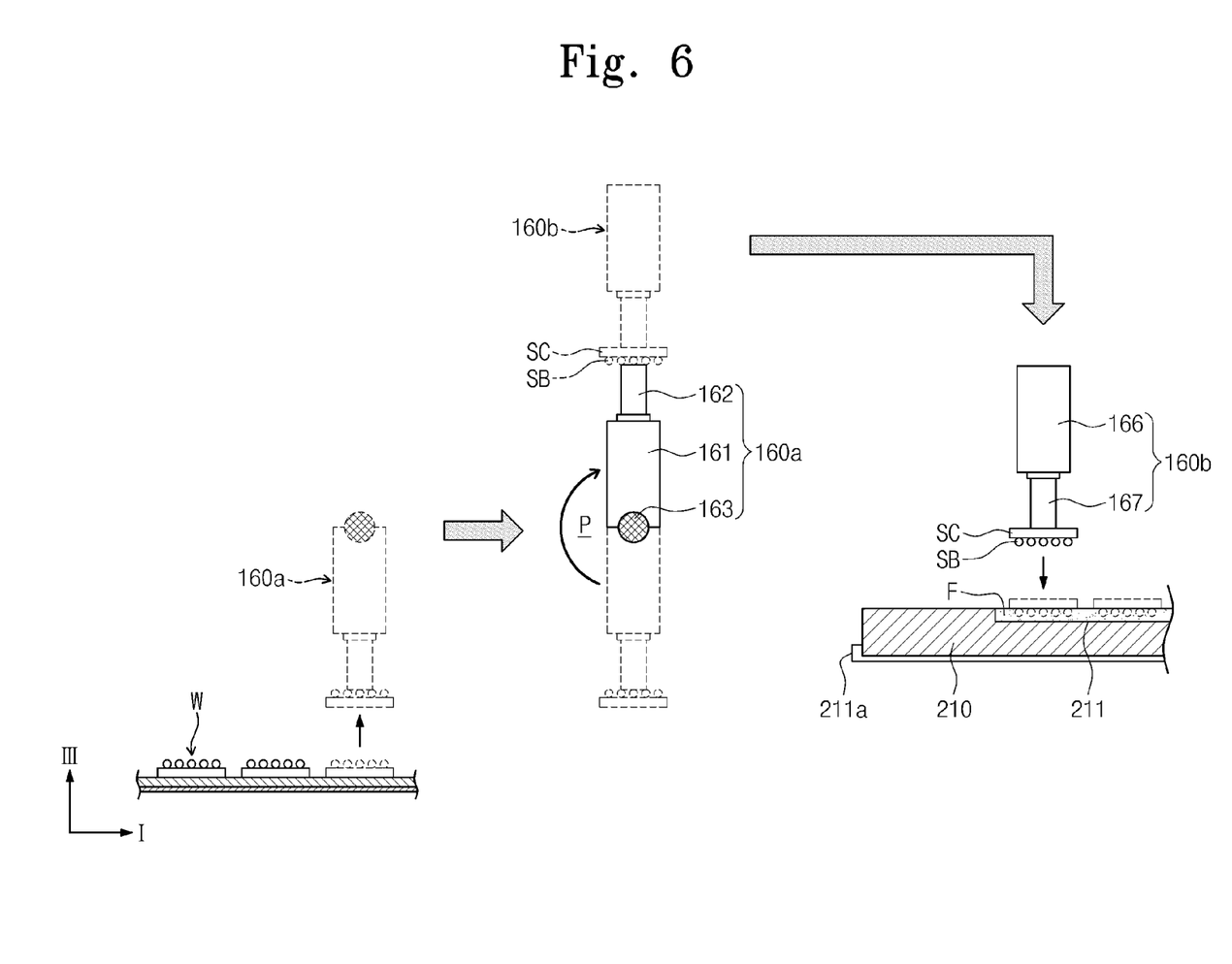
FIG. 6 is a schematic view illustrating a transfer head of FIG. 1 and a process that the transfer head transfers a semiconductor chip.

FIG. 6 is a schematic view illustrating the transfer head of FIG. 1 and a process by which the transfer head transfers a semiconductor chip.

Referring to FIG. 6, the transfer head 160 includes a flip head 160*a* and a landing head 160*b*.

The flip head 160*a* picks up and flips the semiconductor chip SC of the wafer W. The flip head 160*a* may move between a first position in which it attaches to an upper side of the wafer W and a second, delivery position P in which the semiconductor chip SC is flipped. The flip head 160*a* includes a body 161, a flip rod 162, and a shaft rod 163. The flip rod 162 is disposed under the body 161 in the first position. When the flip rod 162 moves upward and downward, a relative distance between the bottom surface of the flip rod 162 to the body 161 may change. A suction hole is disposed in the bottom surface of the flip rod 162. The suction hole is depressurized to pick up the semiconductor chip SC, so that the semiconductor chip SC can be attached to the suction hole. The suction hole is maintained in a depressurized state while the flip head 160*a* holds the semiconductor chip SC. The shaft rod 163 is disposed on the upper end of the body 161 in the first position. The body 161 can rotate about the shaft rod 163. The body 161 rotates about 180° about the shaft rod 163 to flip the semiconductor chip SC, so that the upper surface of the semiconductor chip SC, on which the solder bumps are disposed, is directed downward.

The landing head 160b is disposed between the flip head 160a and the semiconductor chip transfer part 30. The landing head 160b receives the semiconductor chip SC held and flipped by the flip head 160a and places the semiconductor chip SC on the semiconductor chip transfer part 30. The landing head 160b can move between an upper side of the rotated flip head 160a and an upper side of the semiconductor chip transfer part 30. The landing head 160b includes a body 166 and a landing rod 167. The landing rod 167 moves upward and downward to change a relative distance between its bottom surface and its body 166. A suction hole is disposed in the bottom surface of the landing rod 167. When the suction hole is depressurized, the opposite surface of the semiconductor chip SC (the surface opposite the surface on which the solder bumps are disposed) facing the upper surface thereof is attached to the suction hole. The suction hole is maintained in a depressurized state until the landing head 160b places the semiconductor chip SC on the semiconductor chip transfer part 30 from the flip head 160a.

Figure 7:
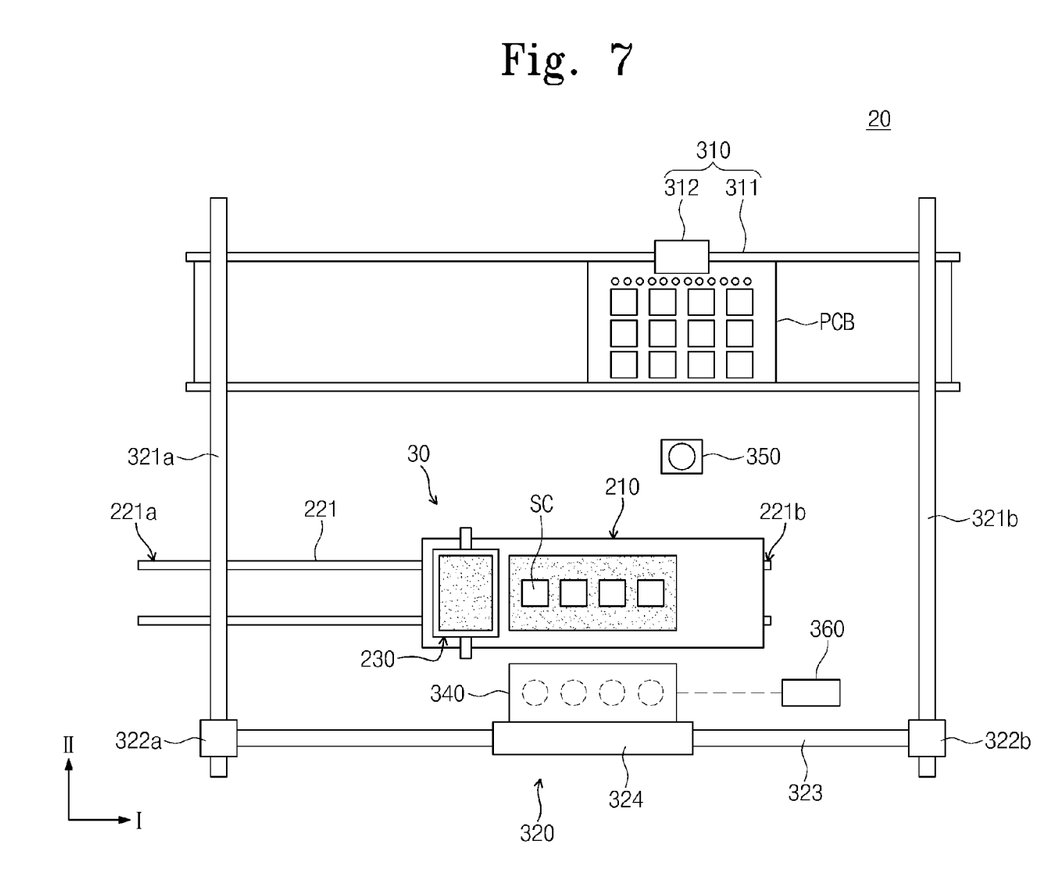
FIG. 7 is a plan view illustrating a semiconductor chip transfer part and a mounting part of FIG. 1.
Figure 8:
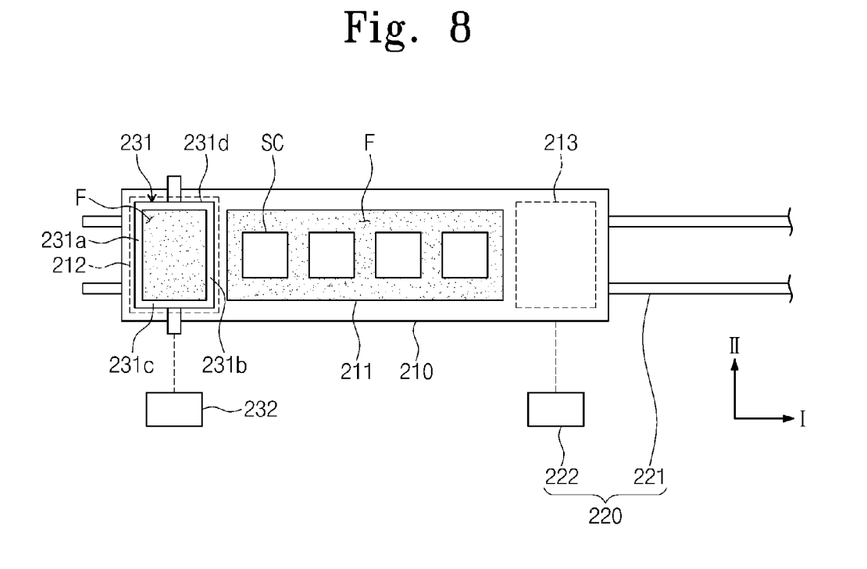
FIG. 8 is a plan view illustrating the semiconductor chip transfer part of FIG. 7.
Figure 9:
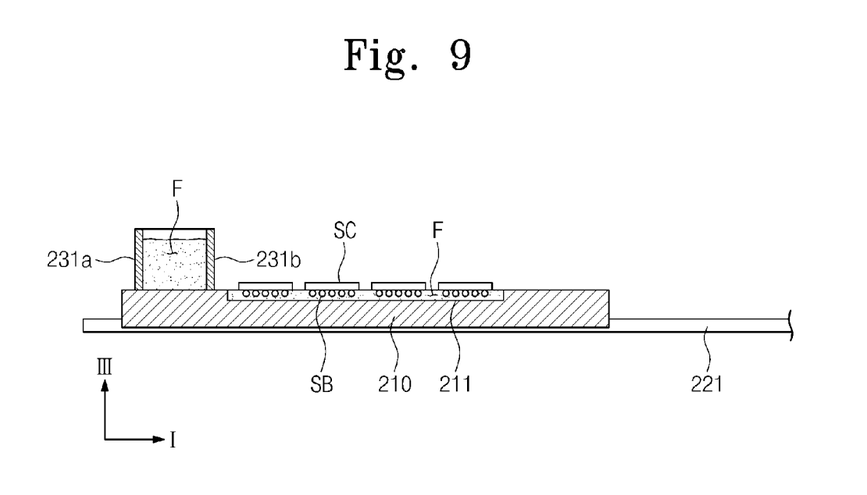
FIG. 9 is a cross-sectional view illustrating the semiconductor chip transfer part of FIG. 7.

FIG. 7 is a plan view illustrating the semiconductor chip transfer part and the mounting part of FIG. 1. FIG. 8 is a plan view illustrating the semiconductor chip transfer part of FIG. 7. FIG. 9 is a cross-sectional view illustrating the semiconductor chip transfer part of FIG. 7.

Referring to FIGS. 7 through 9, the semiconductor chip transfer part 30 includes a flux reservoir 210, a flux reservoir moving unit 220, and a flux supply part 230.

The flux reservoir 210 includes thin plates in a rectangular parallelepiped shape. An accommodation recess 211 is disposed in the upper surface of the flux reservoir 210. The accommodation recess 211 may be disposed in the central region of the flux reservoir 210 and has an area to receive the semiconductor chips SC. The accommodation recess 211 provides a space for accommodating a flux F. The surface of the flux F accommodated in the accommodation recess 211 is disposed at the same height as that of the upper surface of the flux reservoir 210. The flux F is uniformly disposed in the entire region of the accommodation recess 211. The semiconductor chip SC directly transferred by the landing head 160b illustrated in FIG. 6 is placed in the accommodation recess 211. In this way, the solder bumps SB disposed on the upper surface of the semiconductor chip SC are immersed in the flux F.

The upper surface of the ends of the flux reservoir 210 includes stand-by regions 212 and 213. The stand-by regions 212 and 213 are disposed at an input end and an output end of the accommodation recess 211 in the first direction I, respectively. Each of the stand-by regions 212 and 213 has an area that is equal to or greater than that of a bottom surface of a container 231 to be described later.

The flux reservoir moving unit 220 moves the flux reservoir 210 along a straight line in the first direction I. The flux reservoir moving unit 220 includes flux reservoir guide rails 221 and a flux reservoir driving part 222.

The flux reservoir guide rails 221 guide a movement of the flux reservoir 210. The longitudinal direction of the flux reservoir guide rails 221 is the first direction I. The flux reservoir guide rails 221 may be two guide rails spaced apart from each other in the second direction II. An input end 221a of the flux reservoir guide rails 221 is adjacent to the wafer support part 152 of FIG. 4, and the output end 221b of the flux reservoir guide rails 221 is adjacent to the wiring board support part 310. The input end 221a of the flux reservoir guide rails 221 may be referred to as a first point, and the output end 221b may be referred to as a second point.

The flux reservoir driving part 222 moves the flux reservoir 210 along the flux reservoir guide rails 221. The flux reservoir driving part 222 moves the flux reservoir 210 between the first point 221a and the second point 221b.

The flux supply part 230 supplies the flux F to the accommodation recess 211. The flux supply part 230 includes the container 231 and a container moving unit 232. The container 231 is provided in the form of a hexahedron block and is placed on the upper surface of the flux reservoir 210. The container 231 has an inner space, an open upper surface, and an open bottom surface. The container 231 includes first to fourth side walls 231a to 231d. The first side wall 231a extends parallel to the second direction II. The second side wall 231b faces the first side wall 231a and is parallel thereto. The third side wall 231c extends parallel to the first direction I. The fourth side wall 231d faces the third side wall 231c and is parallel thereto. The bottom surfaces of the first to fourth side walls 231a to 231d contact the upper surface of the flux reservoir 210.

Figure 10:
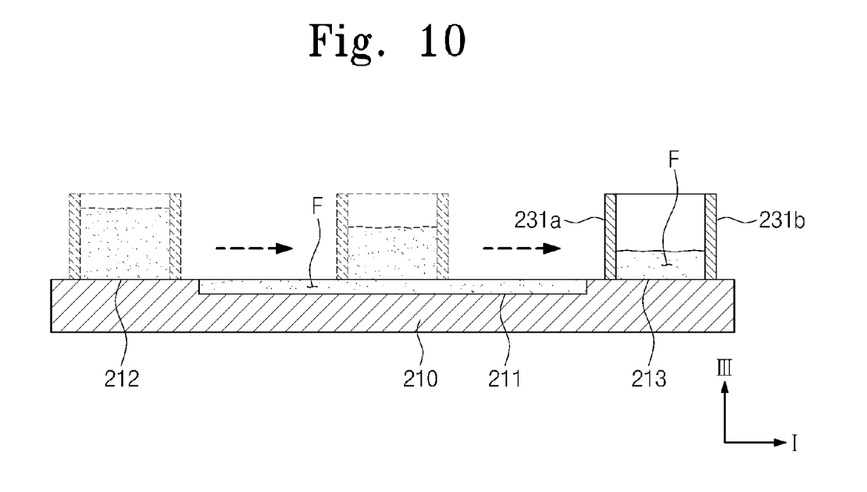
FIG. 10 is a schematic view illustrating a process in which a container of FIG. 8 supplies a flux to an accommodation recess.

The container moving unit 232 moves the container 231 to vary its position with respect to the flux reservoir 210. The container moving unit 232 moves the container 231 between the stand-by regions 212 and 213 disposed at the sides of the accommodation recess 211. The container 231 sequentially and linearly passes by the stand-by region 212, the accommodation recess 211, and the stand-by region 213 or passes by the stand-by region 213, the accommodation recess 211, and the stand-by region 212. While the transfer head 160 of FIG. 4 places the semiconductor chip SC in the accommodation recess 211 or while a mounting head 340 picks up and mounts the semiconductor chips SC on the wiring board PCB, the container 231 waits on the stand-by region 212 or 213. At this point, the flux F is supplied to the container 231 through a flux supply nozzle (not shown). The inner surface of the container 231 and the stand-by regions 212 and 213 together form a storage space for the flux F. The flux F may be supplied to the storage space through the open upper surface of the container 231. While the container 231 moves between the stand-by regions 212 and 213, the flux F contained in the container 231 is supplied to the accommodation recess 211 through the open bottom surface of the container 231. Referring to FIG. 10, when the container 231 moves from the stand-by region 212 to the stand-by region 213, the container 231 is disposed over the accommodation recess 211 and supplies the flux F to the accommodation recess 211. During the moving of the flux reservoir 210, the bottom surface of the first side wall 231a smoothes the upper surface of the flux F accommodated in the accommodation recess 211, forming a substantially planar surface. Since the bottom surface of the first side wall 231a moves at the same height as that of the upper surface of the flux reservoir 210, the surface of the flux F is smoothed at the same height as that of the upper surface of the accommodation recess 211. When the container 231 moves from the stand-by region 213 to the stand-by region 212, the second side wall 231b polarizes the flux F supplied to the accommodation recess 211 in the same manner. The flux F may be supplied while the accommodation recess 211 moves from the second point 221b to the first point 221a. Alternatively, the flux F may be supplied while the accommodation recess 211 waits at the second point 221b or the first point 221a.

Referring to FIG. 7, the mounting part 20 includes the wiring board support part 310, a mounting head unit 320, and an optical inspection member 350.

The wiring board support part 310 receives the wiring board PCB conveyed by the conveyor 121 of FIG. 2 and transfers the wiring board PCB to the reflowing part 40. The wiring board support part 310 supports the wiring board PCB while the semiconductor chips SC are mounted on the wiring board PCB. The wiring board support part 310 includes wiring board transfer rails 311 and a transfer gripper 312. The wiring board transfer rails 311 are adjacent to the output side of the conveyor 121 and extend in the first direction I. The wiring board PCB supplied from the conveyor 121 is placed on the wiring board transfer rails 311. The transfer gripper 312 is disposed on the wiring board transfer rails 311. The transfer gripper 312 supports the wiring board PCB placed on the wiring board transfer rails 311 and moves the wiring board PCB in the first direction I.

The mounting head unit 320 includes first and second lateral guide rails 321a and 321b, which extend in the second direction II and are spaced apart and parallel to each other. First and second lateral driving members 322a and 322b can linearly move along the first and second lateral guide rails 321a and 321b. The first and second lateral driving members 322a and 322b are coupled to opposite ends of a longitudinal guide rail 323, respectively. A longitudinal driving member 324 can linearly move parallel to the first direction I on the longitudinal guide rail 323, and a mounting head 340 is coupled to the longitudinal driving member 324.

Figure 11:
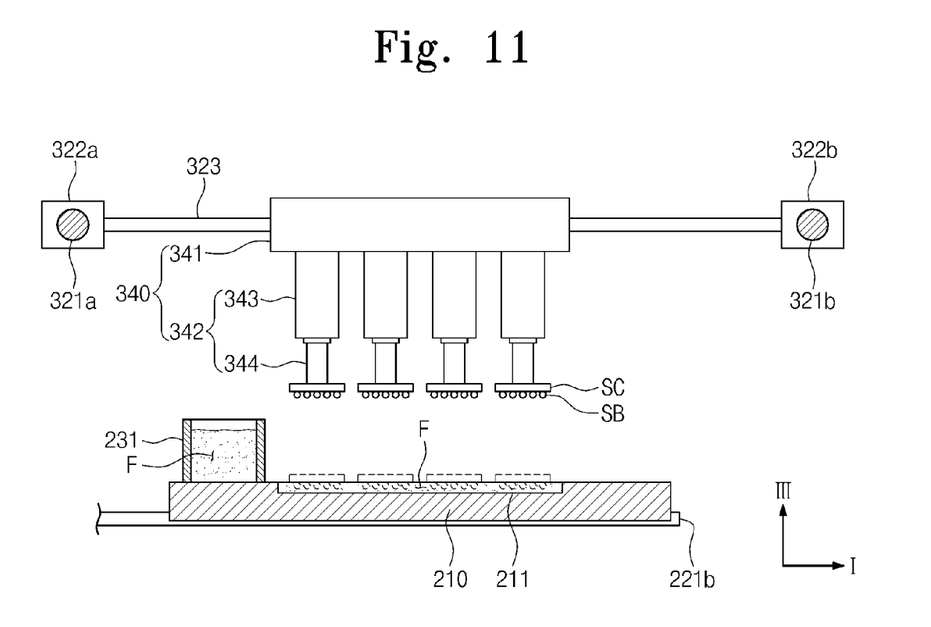
FIG. 11 is a schematic view illustrating a mounting head and a flux reservoir of FIG. 7.

The mounting head 340 is linearly moveable in the second direction II by the first and second lateral guide rails 321a and 321b and the first and second lateral driving members 322a and 322b, and is linearly moveable in the first direction I by the longitudinal guide rail 323 and the longitudinal driving member 324. Referring to FIG. 11, the mounting head 340 includes a bracket 341 coupled to the longitudinal driving member 324 of FIG. 7, and vacuum suction heads 342 installed on the bracket 341. The vacuum suction heads 342 use a vacuum to pick up the semiconductor chips SC from the accommodation recess 211 of the flux reservoir 210. Four vacuum suction heads 342 are coupled to the bracket 341 as illustrated in FIG. 11, however, this embodiment is not limited thereto and there may be more or fewer suction heads. Each of the vacuum suction heads 342 includes a body 343 and a vacuum suction rod 344. The bodies 343 are fixed to the bracket 341, and the vacuum suction rods 344 are disposed under the bodies 343. The vacuum suction rod 344 may move upward and downward to change a relative distance between its bottom surface and the body 343. A suction hole (not shown) is disposed in the bottom surface of the vacuum suction rod 344. When the vacuum suction head 342 picks up the semiconductor chip SC, the suction hole is depressurized such that the semiconductor chip SC is attached to the suction hole. The semiconductor chip SC is attached to the suction hole through the surface of the semiconductor chip SC without the solder bumps SB. While the vacuum suction rod 344 picks up and mounts the semiconductor chip SC on the wiring board PCB, the suction hole is maintained in a depressurized state. The vacuum suction heads 342 can be controlled simultaneously or individually. When the vacuum suction heads 342 pick up the semiconductor chips SC from the flux reservoir 210 or mount the semiconductor chip SC on the wiring board PCB, the vacuum suction rods 344 may move upward and downward simultaneously or individually.

Referring to FIG. 7, the optical inspection member 350 is disposed between the second point 221b and the wiring board transfer rails 311. The optical inspection member 350 reads reference position information of a semiconductor chip mounting region on the wiring board PCB transferred by the wiring board transfer rails 311, and position information of solder bumps of the semiconductor chip SC picked up by the mounting head 340. The solder bumps of the semiconductor chip SC may be aligned with connection pads of the wiring board PCB based on the read position information. A camera or other inspection device as would be understood by one of skill in the art may be used as the optical inspection member 350.

A mounting head control part 360 controls a movement of the mounting head 340 such that a process of picking up the semiconductor chip SC using the mounting head 340, a process of optically inspecting solder bumps of the semiconductor chip SC, and a process of mounting the semiconductor chip SC on a semiconductor chip mounting region of the wiring board PCB are performed sequentially and continuously.

A method of mounting a semiconductor chip on connection pads of a wiring board using a semiconductor chip mounting apparatus configured as described above will now be described.

The wiring board PCB is supplied by the conveyor 121 (refer to FIG. 2), disposed in the loading part 10 of FIG. 1, to the wiring board transfer rails 311, and the transfer gripper 312 transfers the wiring board PCB to a position in which a mounting process is performed.

Referring to FIG. 4, the wafer transfer 146 removes the wafer W from the wafer cassette 141 and places the wafer W on the wafer support part 152. The upper surface of the semiconductor chip SC disposed on the wafer W is directed upward. Referring to FIG. 6, the flip rod 162 of the flip head 160a moves downward to pick up the semiconductor chip SC of the wafer W. The suction hole disposed in the bottom surface of the flip head 160a is depressurized to attach the solder bumps SC of the semiconductor chip SC to the flip rod 162. The flip head 160a holding the semiconductor chip SC moves to the delivery position P. In the delivery position P, the flip head 160a is rotated 180° about the shaft rod 163 to flip the semiconductor chip SC such that the upper surface of the semiconductor chip SC is directed downward. The landing head 160b moves to the delivery position P and receives the semiconductor chip SC. The suction hole disposed in the bottom surface of the landing rod 167 is depressurized such that a surface of the semiconductor chip SC facing the upper surface thereof is attached to the suction hole. The landing head 106b receiving the semiconductor chip SC moves to the semiconductor chip transfer part 30.

While the semiconductor chip SC is picked up and transferred as described above, the flux reservoir 210 is disposed at the first point 221a. The landing head 160b places the semiconductor chip SC in the accommodation recess 211. When the semiconductor chip SC is disposed in the accommodation recess 211, the solder bumps SB are immersed in the flux F. According to the current embodiment, the number of the semiconductor chips SC in the accommodation recess 211 may be four, and the semiconductor chips SC may be arrayed in a straight line along the first direction I.

Referring to FIGS. 7 and 8, when the semiconductor chip SC is placed in the accommodation recess 211, the flux reservoir driving part 222 moves the flux reservoir 210 in the first direction I along the flux reservoir guide rails 221. The flux reservoir 210 is moved along the flux reservoir guide rails 221 to the second point 221b. While the flux reservoir 210 moves, a friction between the flux reservoir 210 and the flux reservoir guide rails 221 may cause a vibration of the flux reservoir 210. This vibration may change the positions of the semiconductor chips SC disposed in the accommodation recess 211. However, since the semiconductor chips SC move in the state in which the solder bumps SB are immersed in the flux F, a vibration of the flux reservoir 210 is absorbed by the flux F, and thus, the vibration is not transmitted to the semiconductor chips SC, and further, the high viscosity of the flux F prevents substantial movement of the semiconductor chip SC.

When the flux reservoir 210 is disposed at the second point 221b, the mounting head 340 is linearly moved in the first direction I by the longitudinal guide rail 323 and the longitudinal driving member 324, and is linearly moved in the second direction II by the first and second lateral guide rails 321a and 321b and the first and second lateral driving members 322a and 322b. Accordingly, the mounting head 340 is moved to a position over the flux reservoir 210. Referring to FIG. 11, the vacuum suction rods 344 of the vacuum suction heads 342 may move upward and downward, simultaneously or individually, to suck and pick up the semiconductor chips SC from the flux reservoir 210. The flux F has been formed on the solder bumps of the picked semiconductor chips SC. The mounting head 340 holding the semiconductor chips SC moves to the upper side of the wiring board PCB.

Figure 12:
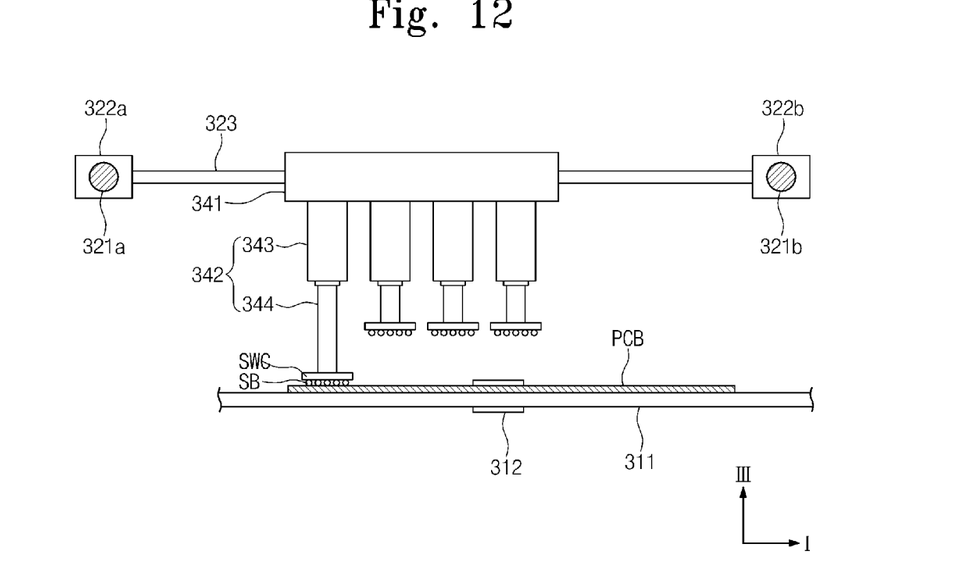
FIG. 12 is a schematic view illustrating a process in which the mounting head of FIG. 7 mounts a semiconductor chip on a wiring board.

The optical inspection member 350 reads reference position information of a semiconductor chip mounting region on the wiring board PCB transferred by the wiring board transfer rails 311. While the mounting head 340 moves the semiconductor chips SC to the wiring board PCB, the semiconductor chip SC picked up by the mounting head 340 is optically inspected to read position information of the solder bumps SB. Based on the read position information, the mounting head 340 moves to the upper side of the wiring board PCB disposed on the wiring board transfer rails 311 to align the solder bumps of the semiconductor chips SC with connection pads of the wiring board PCB. Referring to FIG. 12, the vacuum suction head 342 presses the semiconductor chip SC on the wiring board PCB to attach the solder bumps SB to the connection pads of the wiring board PCB. For the vacuum suction heads 342 to attach the semiconductor chips SC to the connection pads, the vacuum suction rods 344 may move upward and downward simultaneously or individually. At this point, the solder bumps SB are preliminarily attached to the connection pads through the flux F.

As described above, according to exemplary embodiments described herein, a process of picking up a semiconductor chip from a flux reservoir, a process of optically inspecting the semiconductor chip, and a process of mounting the semiconductor chip on a wiring board are performed sequentially and continuously. Therefore, a processing time required for a semiconductor chip transferred by the flux reservoir to be mounted on the wiring board can be reduced.

According to an exemplary embodiment, after the semiconductor chips SC are picked up from the flux reservoir 210 and are mounted on the connection pads of the wiring board PCB, the flux reservoir 210 moves from the second point 221b to the first point 221a. The container 231 moves from the stand-by region 212 to the stand-by region 213 on the flux reservoir 210. At this point, the flux F stored in the container 231 is supplied to the accommodation recess 211 through the open lower part of the container 231. The flux F supplied to the accommodation recess 211 is smoothed into a planar surface by the bottom surface of the first side wall 231a, such that the planar surface of the flux F has the same level as that of the upper surface of the flux reservoir 210. As described above, while the flux reservoir 210 moves from the second point 221b to the first point 221a, the container 231 moves to supply the flux F to the accommodation recess 211. Alternatively, the container 231 may move while the flux reservoir 210 stays at the first point 221a or the second point 221b.

The wiring board PCB, including the preliminarily attached semiconductor chips SC, is transferred to the reflowing part 40 of FIG. 1.

Figure 13:
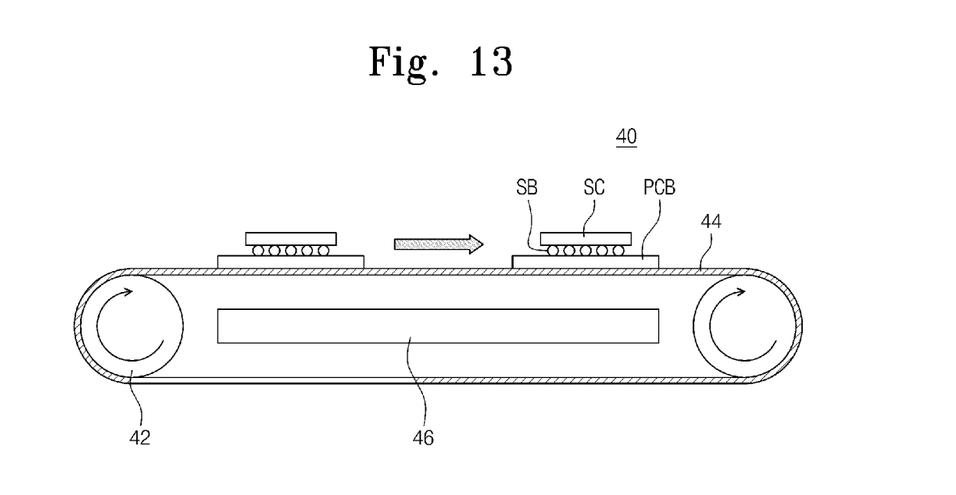
FIG. 13 is a schematic view illustrating a reflowing part of FIG. 1.

FIG. 13 is a schematic view illustrating the reflowing part of FIG. 1. Referring to FIG. 13, the reflowing part 40 may include rollers 42, a conveyor belt 44 driven by the rollers 42, and a heater 46. The wiring board PCB including the preliminarily attached semiconductor chips SC is transferred on the conveyor belt 44 of the reflowing part 40 by the wiring board transfer rails 311 (refer to FIG. 7) of the mounting part 20. While the conveyor belt 44 is driven to move the wiring board PCB in a certain direction, the heater 46 heats and melts the solder bumps of the semiconductor chip SC. The solder bumps SB are completely attached to the connection pads by melting the solder bumps SB.

Referring to FIG. 1, after a reflow process is performed at the reflowing part 40, the semiconductor chips SC and the wiring board PCB are unloaded at the unloading part 50. The unloading part 50 may include a transfer robot 52 and a container 54. The transfer robot 52 receives a wiring board with attached semiconductor chips from the reflowing part 40 and stores the wiring board in the container 54.

Figure 14:
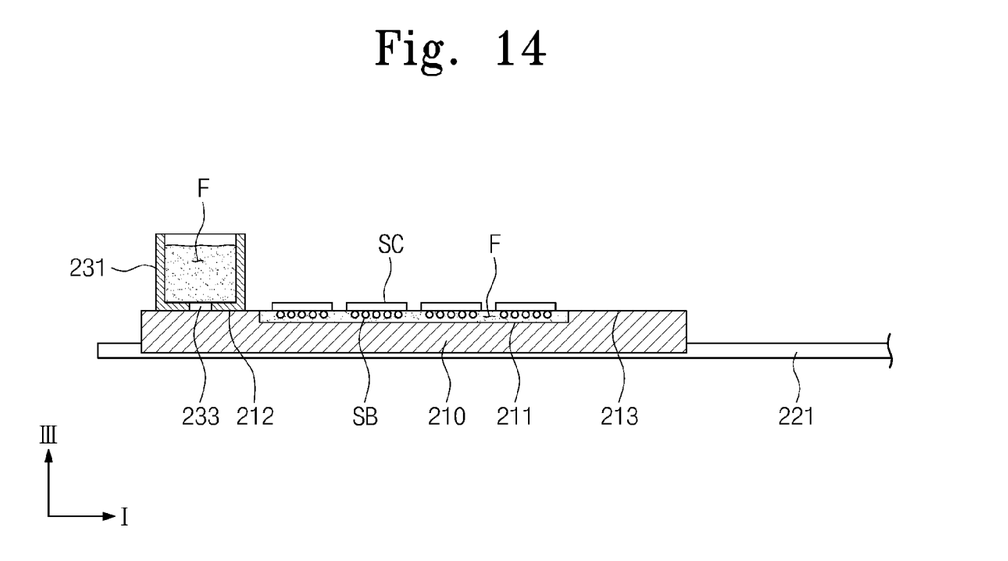
FIG. 14 is a cross-sectional view illustrating a container according to an other exemplary embodiment.

FIG. 14 is a cross-sectional view illustrating a flux supply part according to an exemplary embodiment. Referring to FIG. 14, unlike the exemplary embodiment of FIG. 9 in which the container 231 has the open bottom surface, the container 231 includes a discharge hole 233. The discharge hole 233 supplies the flux F to the accommodation recess 211 while the container 231 moves between the stand-by region 212 and the stand-by region 213. As viewed from the top, the discharge hole 233 may be a slit extending a direction perpendicular to a moving direction of the container 231.

Although the flux reservoir moves linearly in the first direction according to the above-described embodiments, the flux reservoir may alternately move in another direction or may move in a curve.

In addition, although the container contacts and moves on the upper surface of the flux reservoir according to the above-described embodiments, the container may alternately be spaced apart from the flux reservoir and may separately move to supply a flux to the accommodation recess.

According to exemplary embodiments describe herein, the productivity of a surface mount process for a semiconductor chip can be improved and a semiconductor chip can be safely transferred.

The above-described exemplary embodiments are to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:
1. A semiconductor chip mounting apparatus comprising:
a flux reservoir comprising an upper surface including an accommodation recess;
a flux reservoir moving unit which moves the flux reservoir along a moving path;
a wafer support part which is adjacent to the moving path of the flux reservoir and supports a wafer comprising a semiconductor chip;
a wiring board support part which is adjacent to the moving path of the flux reservoir and supports a wiring board;

a transfer head which picks up the semiconductor chip from the wafer support part and places the semiconductor chip in the accommodation recess;

a mounting head which picks up the semiconductor chip from the accommodation recess and mounts the semiconductor chip on the wiring board;

a container which is disposed on the upper surface of the flux reservoir, the container comprising an inner space and an open bottom surface; and a container moving unit which moves the container between a first end and a second end of the accommodation recess, wherein the upper surface of the flux reservoir comprises a first standby region disposed at the first end of the accommodation recess and a second standby region disposed at the second end of the accommodation recess, wherein each of the first standby region and the second standby region has an area equal to or greater than an area of a bottom surface of the container, and the inner space of the container and the first stand-by region together form a first space within which the flux is storable, and the inner space of the container and the second stand-by region together form a second space within which the flux is storable.

2. The semiconductor chip mounting apparatus of claim 1, wherein the flux reservoir moving unit moves the flux reservoir along the moving path between a first point and a second point, the first point is adjacent to the wafer support part, and the second point is adjacent to the wiring board support part.

3. The semiconductor chip mounting apparatus of claim 2, wherein the transfer head comprises:

a flip head which is disposed between the wafer support part and the first point and which picks up the semiconductor chip and flips the semiconductor chip, and a landing head which is disposed between the flip head and the first point and receives the flipped semiconductor chip from the flip head and places the flipped semiconductor chip in the accommodation recess.

4. The semiconductor chip mounting apparatus of claim 2, further comprising a camera which is disposed between the second point and the wiring board support part and captures position information of a solder bump on a surface of the semiconductor chip.

5. The semiconductor chip mounting apparatus of claim 2, wherein the flux reservoir moving unit comprises a flux reservoir guide rail which extends between the first point and the second point and guides a movement of the flux reservoir.

6. The semiconductor chip mounting apparatus of claim 1, wherein the container comprises:

a first side wall extending in a direction perpendicular to a movement direction of the container; and a second side wall opposite the first side wall and parallel to the first side wall, wherein a bottom surface of the first side wall and a bottom surface of the second side wall contact the upper surface of the flux reservoir when the container is moved between the first and the second end of the accommodation recess.

7. A semiconductor chip mounting apparatus comprising:

a flux reservoir guide rail linearly extending in a first direction;

a flux reservoir which is disposed on the flux reservoir guide rail and comprises an upper surface including an accommodation recess configured to be filled with a flux;

a flux reservoir driving part which moves the flux reservoir along the flux reservoir guide rail;

a wafer support part which is adjacent to a first end of the flux reservoir guide rail in the first direction and supports a wafer comprising a semiconductor chip;

a transfer head which is disposed between the wafer support part and the flux reservoir guide rail and picks up the semiconductor chip and places the semiconductor ship in the accommodation recess;

a wiring board support part which is adjacent to a second end of the flux reservoir guide rail in a second direction, perpendicular to the first direction from a top view, and supports a wiring board;

a mounting head which picks up the semiconductor chip from the accommodation recess and mounts the semiconductor chip on the wiring board;

a container which is disposed over the flux reservoir and comprises an inner space for storing the flux and a discharge hole in a bottom surface thereof, wherein the discharge hole communicates with the inner space; and a container moving unit which moves the container between a first end and a second end of the accommodation recess.

8. The semiconductor chip mounting apparatus of claim 7, wherein the bottom surface of the container contacts an upper surface of the flux reservoir.

9. The semiconductor chip mounting apparatus of claim 7, wherein the transfer head comprises:

a flip head which picks up and flips the semiconductor chip; and a landing head which receives the flipped semiconductor chip from the flip head and places the semiconductor chip in the accommodation recess.

10. The semiconductor chip mounting apparatus of claim 7, further comprising a camera which is disposed between the wiring board support part and the second end of the flux reservoir guide rail and optically inspects a solder bump disposed on an upper surface of the semiconductor chip.

11. The semiconductor chip mounting apparatus of claim 10, further comprising a mounting head control part which controls a movement of the mounting head to sequentially and continuously perform the picking up of the semiconductor chip by the mounting head and the inspecting of the solder bump.

* * * * *